United States Patent
Bennett et al.

(10) Patent No.: US 7,624,239 B2
(45) Date of Patent: *Nov. 24, 2009

(54) METHODS FOR THE MANAGEMENT OF ERASE OPERATIONS IN NON-VOLATILE MEMORIES

(75) Inventors: Alan David Bennett, Edinburgh (GB); Alan Douglas Bryce, Allanfield (GB); Sergey Anatolievich Gorobets, Edinburgh (GB)

(73) Assignee: SanDisk Corporation, Milpitas, CA (US)

( * ) Notice: Subject to any disclaimer, the term of this patent is extended or adjusted under 35 U.S.C. 154(b) by 84 days.

This patent is subject to a terminal disclaimer.

(21) Appl. No.: 11/273,774

(22) Filed: Nov. 14, 2005

(65) Prior Publication Data

US 2007/0113030 A1    May 17, 2007

(51) Int. Cl.
    *G06F 13/12* (2006.01)
(52) U.S. Cl. ...................... 711/159; 711/103
(58) Field of Classification Search .............. 711/103, 711/159
    See application file for complete search history.

(56) References Cited

U.S. PATENT DOCUMENTS

| | | | |
|---|---|---|---|
| 4,677,606 A | 6/1987 | Ogata et al. | |
| 5,321,651 A | 6/1994 | Monk | |
| 5,576,989 A | 11/1996 | Kowalski | |
| 5,838,614 A | 11/1998 | Estakhri et al. | |
| 5,966,720 A * | 10/1999 | Itoh et al. | 711/1 |
| 6,512,702 B1 | 1/2003 | Yamamura et al. | |
| 6,564,307 B1 | 5/2003 | Micka et al. | |
| 6,591,327 B1 * | 7/2003 | Briner et al. | 711/103 |
| 6,601,132 B2 | 7/2003 | Nomura et al. | |
| 6,646,921 B2 | 11/2003 | Roohparvar | |
| 6,662,334 B1 | 12/2003 | Stenfort | |
| 2002/0026566 A1 | 2/2002 | Awada et al. | |
| 2002/0069314 A1 | 6/2002 | Miyauchi | |
| 2003/0099134 A1 | 5/2003 | Lasser et al. | |
| 2004/0095666 A1 | 5/2004 | Asano et al. | |
| 2005/0036390 A1 | 2/2005 | Nakada et al. | |

FOREIGN PATENT DOCUMENTS

WO    03/010671 A1    2/2003

OTHER PUBLICATIONS

Office Action for U.S. Appl. No. 11/273,773 mailed May 22, 2008, 19 pages.
Office Action for U.S. Appl. No. 11/273,773 mailed Jan. 2, 2009, 28 pages.
Paolo et al., "Flash Memory Cells—An Overview," Aug. 1997, *IEEE Proceedings*, vol. 85, No. 8, pp. 1248-1271.

* cited by examiner

Primary Examiner—Reginald G Bragdon
Assistant Examiner—Kenneth M Lo
(74) Attorney, Agent, or Firm—Davis Wright Tremaine LLP

(57) ABSTRACT

The present invention presents a number of improvements for managing erase processes in non-volatile memory. Such memory systems typically manage the memory by logically organize the basic unit of physical erase (erase block) into composite logical groupings (meta-blocks or logical group), where an erase block generally consists of a number of sectors. When an erase command is received, the specified sectors are checked against the memory system's control data. If the specified sectors span any full logical grouping, the full logical groupings can each be treated as a whole and erased according to one process (such as performing a true, physical erase), while other sectors are "logically" erased at the sector level by standard techniques.

10 Claims, 10 Drawing Sheets

Multi-Mode Erase Process

Multi-Mode Erase Process

METHODS FOR THE MANAGEMENT OF ERASE OPERATIONS IN NON-VOLATILE MEMORIES

CROSS-REFERENCE TO RELATED APPLICATION

The present application is related to U.S. application Ser. No. 11/273,773, of Bennett et al., entitled "Structures for the Management of Erase Operations in Non-Volatile Memories," which is filed concurrently with the present application and is hereby incorporated herein, in its entirety, by this reference.

FIELD OF THE INVENTION

This invention relates generally to non-volatile semiconductor memory and specifically to the management of erase processes in such memories.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

In EEPROM memory, as well as in other forms of non-volatile memory, the memory cells need to be erased before they can be rewritten with new data content. When the data in a portion of the memory becomes obsolete, or the memory receives a command to erase a particular portion, in more advanced memory systems it is common for the designated portions not to be erased immediately at that time, but to be "logically erased" by being marked for erase, with the actual, physical erase taking place at a later time. This may be done for a number of reasons. As noted above, an erase process typically takes quite a bit longer than a simple write. The write is also often simpler to execute. Thus, when a data portion becomes obsolete or is chosen for erase, the memory system will instead write a data pattern to the memory portion, set a flag, or otherwise designate it as erased. Once the memory has time, or is need of additional erased sectors, the "logically erased" portion can then be physically erased when convenient, for example in a background process. It may also be the case that the portion of the memory to be erased is less than the minimum unit of erase for the memory. For example, a flash memory could receive a command to erase a sector of data. However, flash memories are commonly formed such that the basic physical unit of erase is block, typically composed of multiple sectors. These erase blocks are then usually combined into composite logical structures, such as meta-blocks or other logical groups, which the controller then treats as a basic unit for memory management. As multiple sectors are grouped together in erase blocks, meta-blocks and/or other logical groupings, to erase a single sector is not usually possible, as this would also erase the rest of the corresponding meta-block or larger logical structure. Consequently, it is usually preferable to just mark the specific sector as "logically" erased until it makes sense to physically erase the whole of the erase unit to which it belongs.

Such improvements in the management of erase processes generally improve the performance of non-volatile memories; however, there are circumstances when the logical erase of memory portions can itself take longer than is allowed for by the memory system. For example, when a memory needs to erase a very large number of memory sectors, the writing of the erased data pattern or setting of erased flags can result in a large number of write operations. This may take even longer than an actual physical erase process and result in a time out. As an extreme example, to logically erase an entire memory, in response to a reformat command for example, would require the writing of the erase data pattern to the entire memory.

Therefore there is a general need for high capacity and high performance non-volatile memory. In particular, there is a need to have a high capacity nonvolatile memory able to conduct erase operations without the aforementioned problems.

SUMMARY OF INVENTION

According to a principle aspect, the present invention improves the erase process by splitting erase commands into portions corresponding to a full logical group (a group of contiguous sectors usually the same size as a meta-block or other logical grouping of erase blocks), which can then be physically erased or otherwise subjected as a whole to an erase operation, and portions corresponding to only part of a logical group (such as individual sectors), which are logically erased by, for example, writing a pattern corresponding to an erased state or setting an indication in the sectors header. When a host issues an Erase Sectors command, the memory system uses its control data structures, by with the controller organizes the erase blocks of the memory into logical units, to determine which, if any, of the specified sectors span a full logical group. When a full logical group to be erased, the memory can execute the command by the means of physical block erases rather than by writing the erased sector pattern to all sectors. By doing this, the execution time can be made much shorter, especially in the case when the entire card is erased by a single command. According to another aspect, the invention solves problems that may arise due to power loss recovery. This may occur as a block, which was being erased when power was lost, may look corrupted or the either erased or well programmed, but may be disturbed by the previously aborted erase operation. In a further aspect, the invention is able is to provide compatibility with the protocols where the system needs to return the information about whether the sector being read was erased by an Erase Sectors command or not. In another aspect of the present invention, an "erased block" (or "erased sector") status can be returned if a sector belonging to the block (or the sector itself) is erased.

A number of embodiments are presented allowing for physical erase of full logical groups that allow the system to recover in the case of a power loss event. These embodiments typically feature the use of a special record, stored in the non-volatile memory about the erase operation to be performed, where the record can be updated at the completion of the erase operation.

Generally, the various embodiments of the invention concern methods, and corresponding circuitry and firmware, to execute an erase or erase equivalent (such as marks or flags can be detected and an erased data pattern can be sent to the host if it reads a sector from the erased logical grouping) when the erase command specifies a complete meta-block or other logical grouping. Further, in case of a read, the erased status of the sector or logical grouping can be returned in addition to the erased data pattern. Among the various aspects of the present invention that are found on some or all of the embodiments is the marking of, of setting a flag for, a sector or logical grouping to indicate that it is erase. A further aspect is the true physical erase of one or a set of logical groupings of physical erase units when the system determines that the erase command specifies one or more complete logical groupings. Additionally, in the case of such physical erase, safety flags or an information record can be maintained, allowing for power loss recovery and erase completion, and progress information can be maintained for the case of erasing multiple logical groupings. Yet more aspects relate to the system returning an erases status and returning erased data in response to a read command.

Additional features and advantages of the present invention will be understood from the following description of its preferred embodiments, which description should be taken in conjunction with the accompanying drawings.

DETAILED DESCRIPTION OF THE PREFERRED EMBODIMENTS

Figure 1:
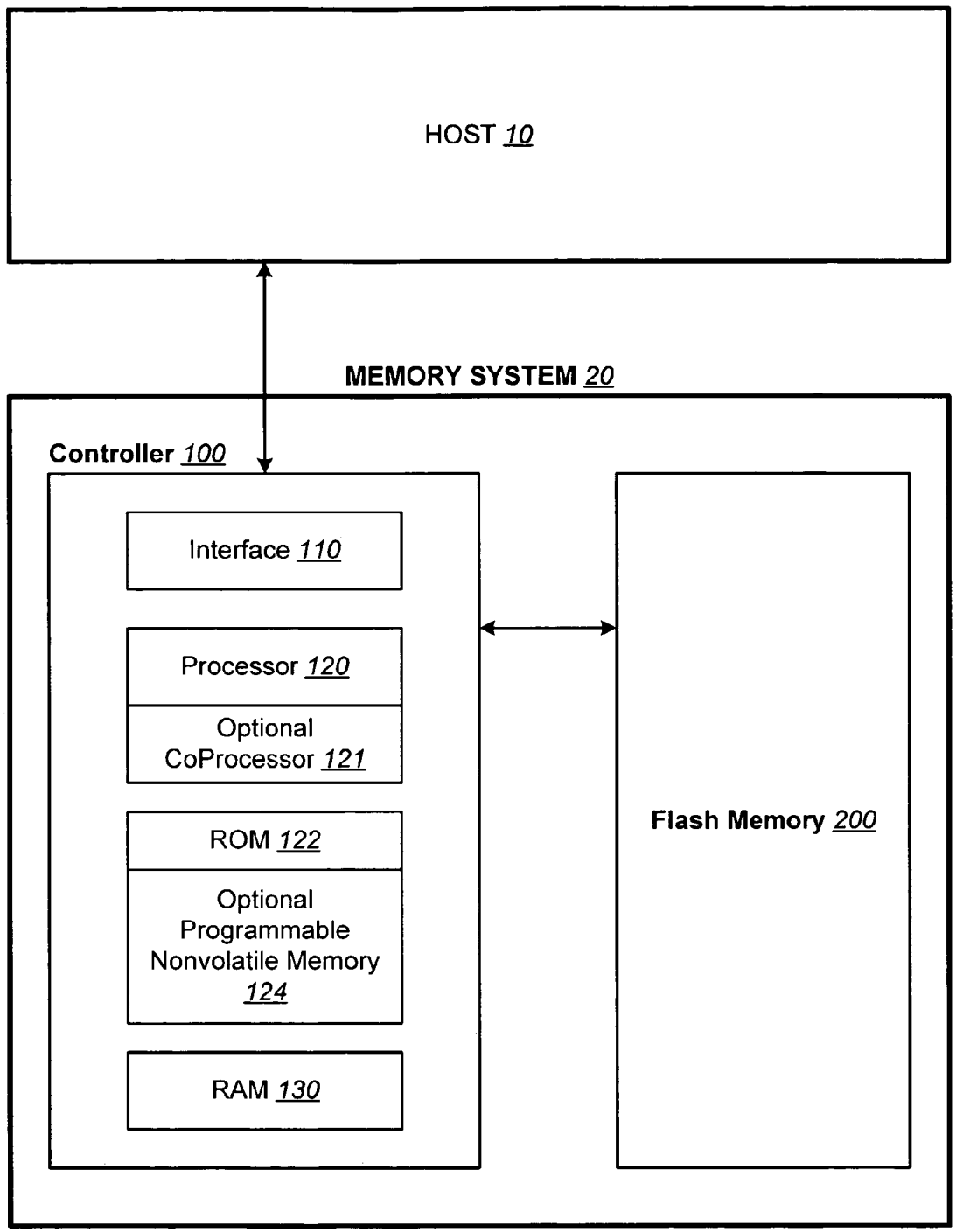
FIG. 1 illustrates schematically the main hardware components of a memory system suitable for implementing the present invention.

As noted in the Background section, in EEPROM memory and other forms of non-volatile memory, the memory cells need to be erased before they can be rewritten with new data content. In response to an erase command, originating either from the host or with the memory system itself, in more advanced memory systems it is common for the designated portions not to be erased immediately at that time, but to be "logically erased" by being marked for erase, with any needed actual, physical erase taking place at a later time. It may even be that the physical erase never be executed, because physical erase is replaced by erased data pattern writes, as this often results in a simpler implementation of imitation of host writes. (It should be noted that sectors written with erased data pattern may differ from erased sectors, as they may have valid header and ECC.) Although such improvements in the management of erase processes generally improve the performance of non-volatile memories, there are circumstances when the logical erase of memory portions can itself take longer than is allowed for by the memory system. For example, when a memory needs to erase a very large number of memory sectors, the writing of the erased data pattern or setting of erased flags can result in a large number of write operations. This may take even longer than an actual physical erase process and result in a time out. As an extreme example, to logically erase an entire memory, in response to a reformat command for example, would require the writing of the erase data pattern to the entire memory.

According to a main aspect of the present invention, if a host issues an Erase Sectors command, the system executes the command by the means of physical block erases for those portions of the specified sectors that form complete blocks, rather than by writing the erased sector pattern ("logical erase") to all sectors. For the specified sectors not forming complete block, the system uses the system's standard, logical erase method. By doing this, the execution time can be made much shorter, especially in the case when the entire card is erased by a single command.

In other aspects of the present invention, the system introduces methods for power loss recovery, as a block, which was being erased when the power was lost, may look corrupted. Alternately, the block may look erased or well programmed but may be disturbed by the previously aborted erase operation. Other aspects of the invention provide compatibility with protocols, such as the Memory Stick-type Protocols, where the system needs to return the information about whether the sector being read was erased by an Erase Sectors command or not, or whether the erased sector was erased by a full logical group erase command.

More specifically, the invention presents various methods of Erase Sector command execution by doing a true, physical block erase so that the system can recover in the case of a power loss event. In general, most of the presented techniques use a special record, stored in the non-volatile memory about the erase operation to be performed, where the record can be updated at the completion of the erase operation. When an erase command is received, whether from the host or originating on the memory system, the specified sectors are checked to see which, if any, form complete logical groups. Any sectors not forming a complete group can be erased according to the memory's standard method, while complete logical groups can be erased by a more efficient method, such as a true, physical erase process.

To provide context for the various aspects and embodiments of the present invention, the following discussion begins by describing a memory system with an advanced data structure management. This particular memory system is developed in more detail in U.S. patent application Ser. Nos. 10/750,155, 10/917,888, 10/917,867, 10/917,889, and 10/917,725, from which are extracted below.

Example of a Non-Volatile Memory System

FIG. 1 illustrates schematically the main hardware components of a memory system suitable for implementing the present invention. The memory system 20 typically operates with a host 10 through a host interface. The memory system is typically in the form of a memory card or an embedded memory system. The memory system 20 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-onlymemory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

A) Logical and Physical Block Structures

Figure 2:
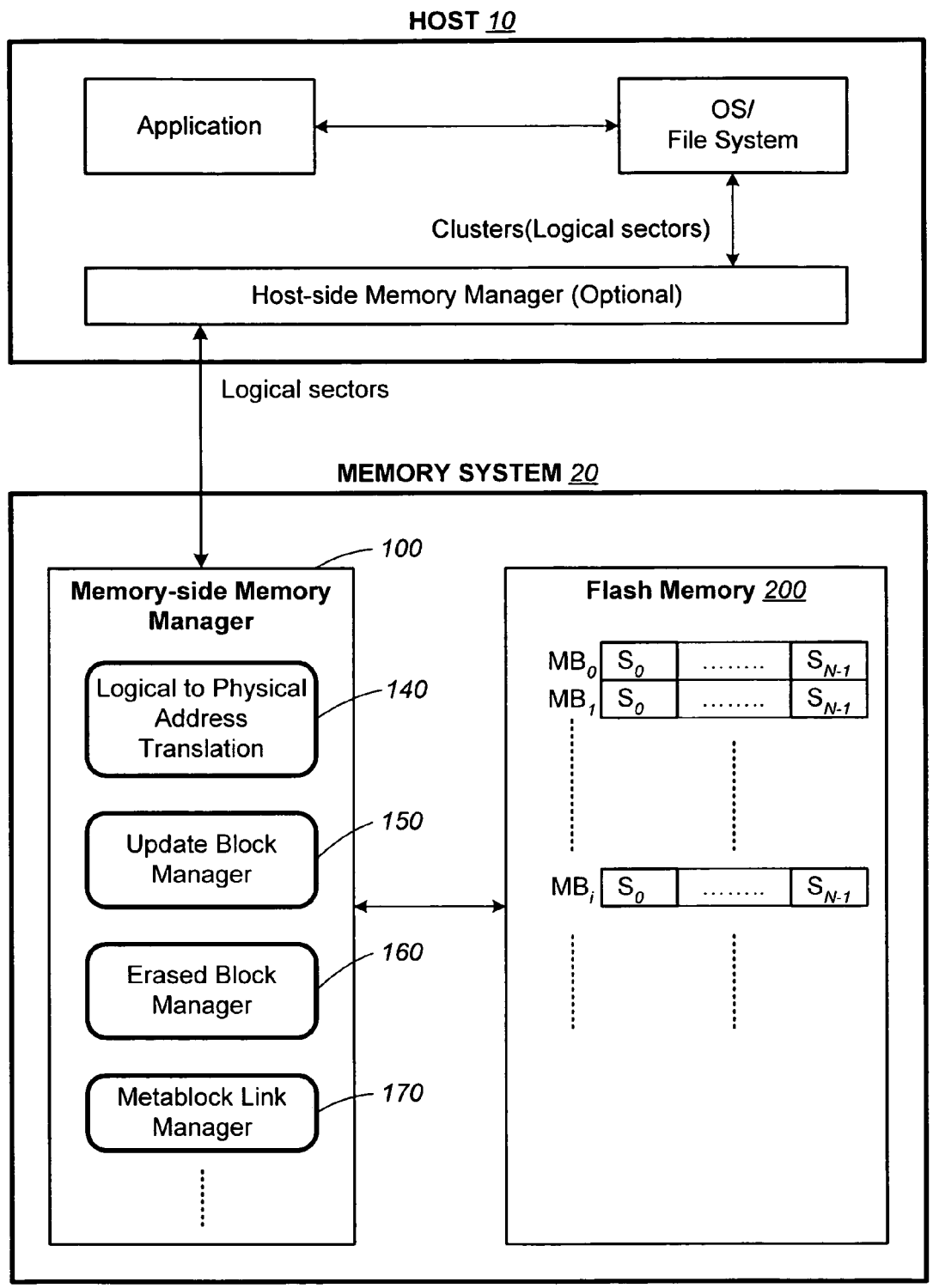
FIG. 2 illustrates the memory being organized into physical groups of sectors (or metablocks) and managed by a memory manager of the controller, according to a preferred embodiment of the invention.

FIG. 2 illustrates the memory being organized into physical groups of sectors (or metablocks) and managed by a memory manager of the controller, according to a preferred embodiment of the invention. The memory 200 is organized into metablocks, where each metablock is a group of physical sectors $S_0, \ldots, S_{N-1}$ that are erasable together.

The host 10 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 10 essentially issues a command to the memory system 20 to read or write a segment containing a string of logical sectors of data with contiguous addresses.

A memory-side memory manager is implemented in the controller 100 of the memory system 20 to manage the storage and retrieval of the data of host logical sectors among metablocks of the flash memory 200. In the preferred embodiment, the memory manager contains a number of software modules for managing erase, read and write operations of the metablocks. The memory manager also maintains system control and directory data associated with its operations among the flash memory 200 and the controller RAM 130.

Figure 3A:
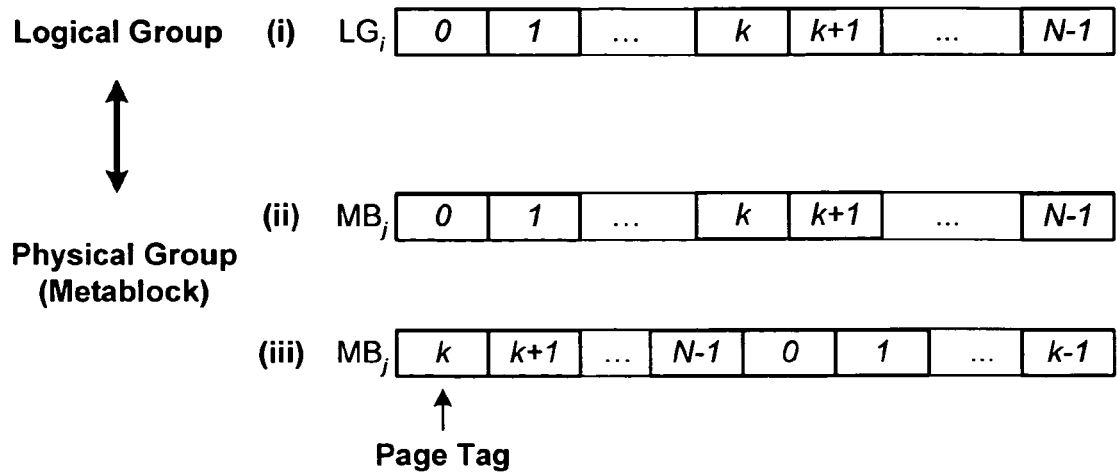
FIGS. 3A(i)-3A(iii) illustrate schematically the mapping between a logical group and a metablock, according to a preferred embodiment of the present invention.

FIGS. 3A(i)-3A(iii) illustrate schematically the mapping between a logical group and a metablock, according to a preferred embodiment of the present invention. The metablock of the physical memory has N physical sectors for storing N logical sectors of data of a logical group. FIG. 3A(i) shows the data from a logical group $LG_i$, where the logical sectors are in contiguous logical order 0, 1, ..., N-1. FIG. 3A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 3A(iii), the metablock stores in its first location beginning with the data of logical sector k. When the last logical sector N-1 is reached, it wraps around to sector 0 and finally storing data associated with logical sector k-1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 3B:
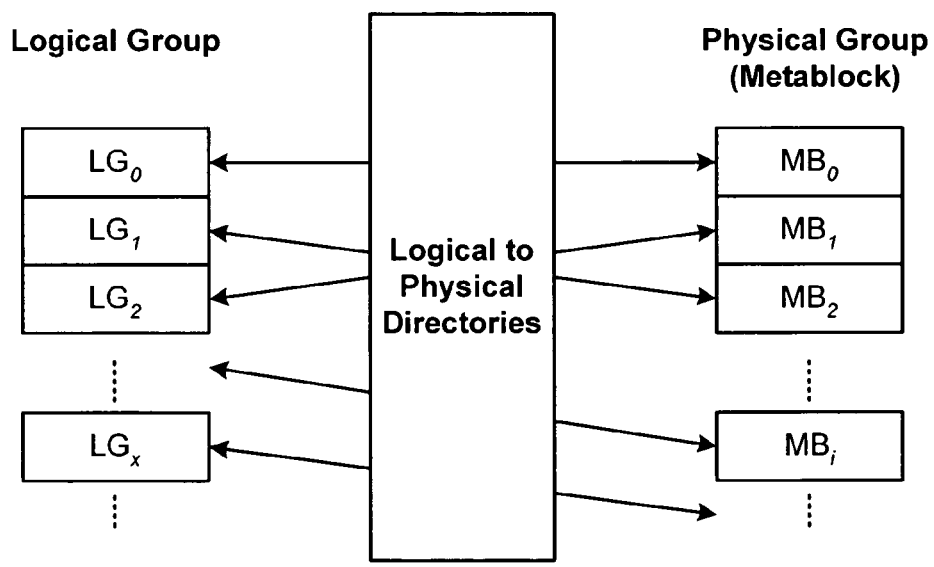
FIG. 3B illustrates schematically the mapping between logical groups and metablocks.

FIG. 3B illustrates schematically the mapping between logical groups and metablocks. Each logical group is mapped to a unique metablock, except for a small number of logical groups in which data is currently being updated. After a logical group has been updated, it may be mapped to a different metablock. The mapping information is maintained in a set of logical to physical directories, which will be described in more detail later.

Other types of logical group to metablock mapping are also contemplated. For example, metablocks with variable size are disclosed in co-pending and co-owned U.S. patent application Ser. No. 10/749,189, entitled, "Adaptive Metablocks". The entire disclosure of the co-pending application is hereby incorporated herein by reference.

One feature of the invention is that the system operates with a single logical partition, and groups of logical sectors throughout the logical address range of the memory system are treated identically. For example, sectors containing system data and sectors containing user data can be distributed anywhere among the logical address space.

Unlike prior art systems, there is no special partitioning or zoning of system sectors (i.e., sectors relating to file allocation tables, directories or sub-directories) in order to localize in logical address space sectors that are likely to contain data with high-frequency and small-size updates. Instead, the present scheme of updating logical groups of sectors will efficiently handle the patterns of access that are typical of system sectors, as well as those typical of file data.

Figure 4:
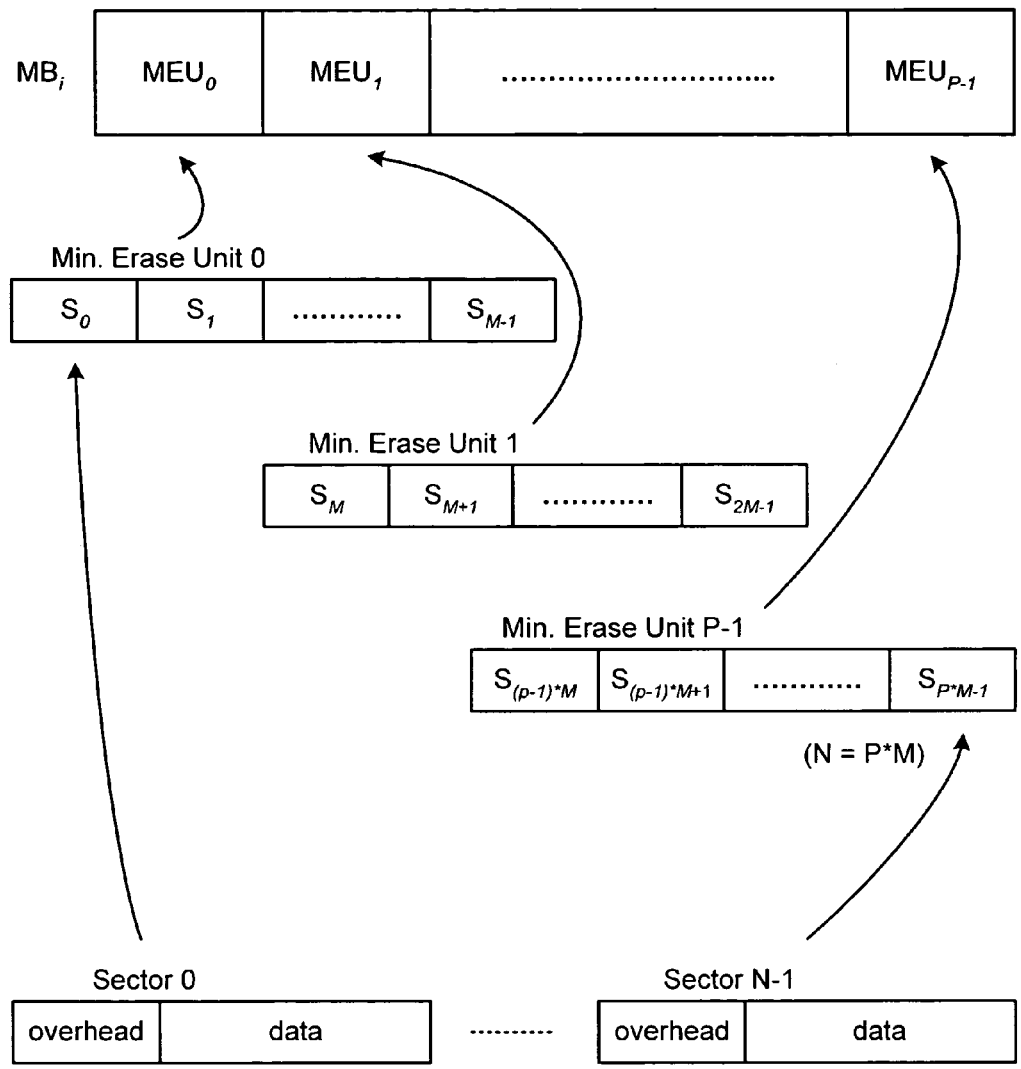
FIG. 4 illustrates the alignment of a metablock with structures in physical memory.

FIG. 4 illustrates the alignment of a metablock with structures in physical memory. Flash memory comprises blocks of memory cells which are erasable together as a unit. Such erase blocks are the minimum unit of erasure of flash memory or minimum erasable unit (MEU) of the memory. The minimum erase unit is a hardware design parameter of the memory, although in some memory systems that supports multiple MEUs erase, it is possible to configure a "super MEU" comprising more than one MEU. For flash EEPROM, a MEU may comprise one sector but preferably multiple sectors. In the example shown, it has M sectors. In the preferred embodiment, each sector can store 512 bytes of data and has a user data portion and a header portion for storing system or overhead data. If the metablock is constituted from P MEUs, and each MEU contains M sectors, then, each metablock will have N=P*M sectors.

The metablock represents, at the system level, a group of memory locations, e.g., sectors that are erasable together. The physical address space of the flash memory is treated as a set of metablocks, with a metablock being the minimum unit of erasure. Within this specification, the terms "metablock" and "block" are used synonymously to define the minimum unit of erasure at the system level for media management, and the term "minimum erase unit" or MEU is used to denote the minimum unit of erasure of flash memory.

B) Linking of Minimum Erase Units (MEUs) to Form a Metablock

In order to maximize programming speed and erase speed, parallelism is exploited as much as possible by arranging for multiple pages of information, located in multiple MEUs, to be programmed in parallel, and for multiple MEUs to be erased in parallel.

In flash memory, a page is a grouping of memory cells that may be programmed together in a single operation. A page may comprise one or more sector. Also, a memory array may be partitioned into more than one plane, where only one MEU within a plane may be programmed or erased at a time. Finally, the planes may be distributed among one or more memory chips.

In flash memory, the MEUs may comprise one or more page. MEUs within a flash memory chip may be organized in planes. Since one MEU from each plane may be programmed or erased concurrently, it is expedient to form a multiple MEU metablock by selecting one MEU from each plane (see FIG. 5B below.)

Figures 5A, 5B, 5C:
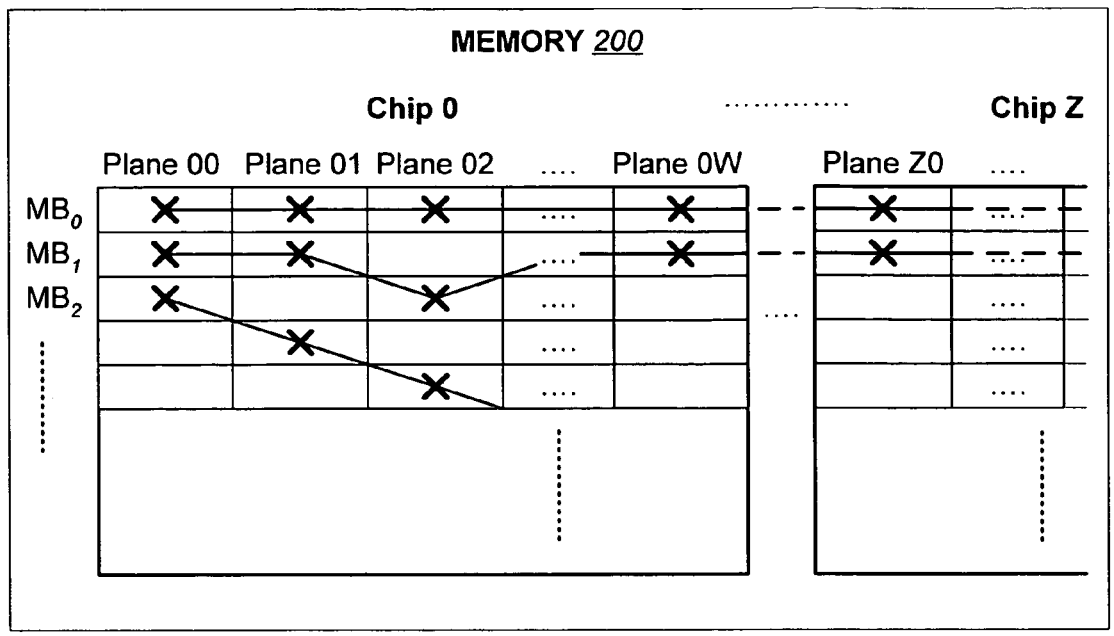
FIG. 5A illustrates metablocks being constituted from linking of minimum erase units of different planes.
FIG. 5B illustrates one embodiment in which one minimum erase unit (MEU) is selected from each plane for linking into a metablock.
FIG. 5C illustrates another embodiment in which more than one MEU are selected from each plane for linking into a metablock.

FIG. 5A illustrates metablocks being constituted from linking of minimum erase units of different planes. Each metablock, such as MB0, MB1, . . . , is constituted from MEUs from different planes of the memory system, where the different planes may be distributed among one or more chips. The metablock link manager 170 shown in FIG. 2 manages the linking of the MEUs for each metablock. Each metablock is configured during an initial formatting process, and retains its constituent MEUs throughout the life of the system, unless there is a failure of one of the MEUs.

FIG. 5B illustrates one embodiment in which one minimum erase unit (MEU) is selected from each plane for linking into a metablock.

FIG. 5C illustrates another embodiment in which more than one MEU are selected from each plane for linking into a metablock. In another embodiment, more than one MEU may be selected from each plane to form a super MEU. For example, a super MEU may be formed from two MEUs. In this case, it may take more than one pass for read or write operation.

The linking and re-linking of MEUs into metablocks is also disclosed in co-pending and co-owned U.S. patent application Ser. No. 10/750,157, entitled "Adaptive Deterministic Grouping of Blocks into Multi-Block Structures". The entire disclosure of the co-pending application is hereby incorporated herein by reference.

C) Metablock Management

Figure 6:
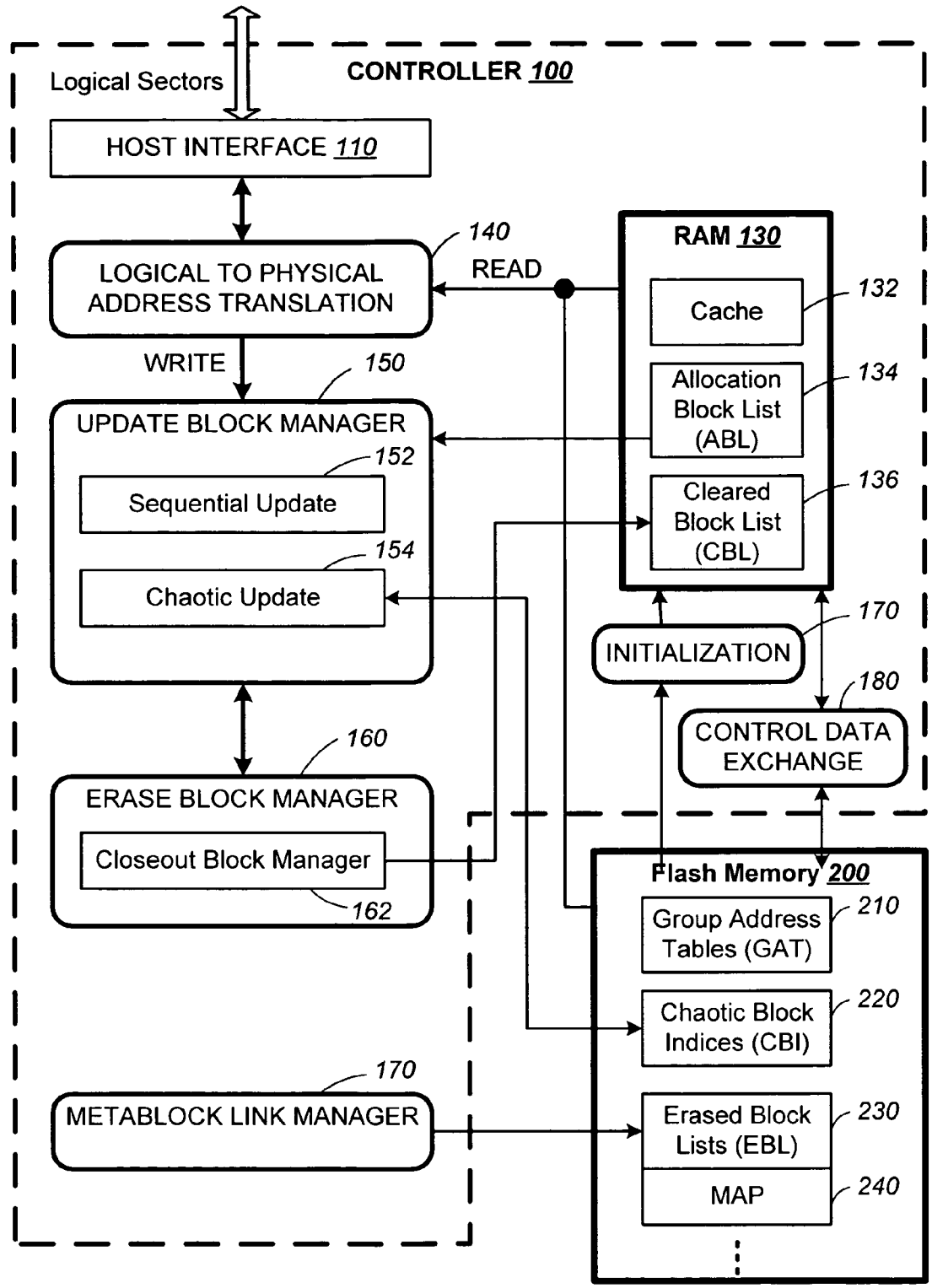
FIG. 6 is a schematic block diagram of the metablock management system as implemented in the controller and flash memory.

FIG. 6 is a schematic block diagram of the metablock management system as implemented in the controller and flash memory. The metablock management system comprises various functional modules implemented in the controller 100 and maintains various control data (including directory data) in tables and lists hierarchically distributed in the flash memory 200 and the controller RAM 130. The function modules implemented in the controller 100 includes an interface module 110, a logical-to-physical address translation module 140, an update block manager module 150, an erase block manager module 160 and a metablock link manager 170.

The interface 110 allows the metablock management system to interface with a host system. The logical to physical address translation module 140 maps the logical address from the host to a physical memory location. The update block Manager module 150 manages data update operations in memory for a given logical group of data. The erased block manager 160 manages the erase operation of the metablocks and their allocation for storage of new information. A metablock link manager 170 manages the linking of subgroups of minimum erasable blocks of sectors to constitute a given metablock. Detailed description of these modules will be given in their respective sections.

During operation the metablock management system generates and works with control data such as addresses, control and status information. Since much of the control data tends to be frequently changing data of small size, it can not be readily stored and maintained efficiently in a flash memory with a large block structure. A hierarchical and distributed scheme is employed to store the more static control data in the nonvolatile flash memory while locating the smaller amount of the more varying control data in controller RAM for more efficient update and access. In the event of a power shutdown or failure, the scheme allows the control data in the volatile controller RAM to be rebuilt quickly by scanning a small set of control data in the nonvolatile memory. This is possible because the invention restricts the number of blocks associated with the possible activity of a given logical group of data. In this way, the scanning is confined. In addition, some of the control data that requires persistence are stored in a nonvolatile metablock that can be updated sector-by-sector, with each update resulting in a new sector being recorded that supercedes a previous one. A sector indexing scheme is employed for control data to keep track of the sector-by-sector updates in a metablock.

The non-volatile flash memory 200 stores the bulk of control data that are relatively static. This includes group address tables (GAT) 210, chaotic block indices (CBI) 220, erased block lists (EBL) 230 and MAP 240. The GAT 210 keeps track of the mapping between logical groups of sectors and their corresponding metablocks. The mappings do not change except for those undergoing updates. The CBI 220 keeps track of the mapping of logically non-sequential sectors during an update. The EBL 230 keeps track of the pool of metablocks that have been erased. MAP 240 is a bitmap showing the erase status of all metablocks in the flash memory.

The volatile controller RAM 130 stores a small portion of control data that are frequently changing and accessed. This includes an allocation block list (ABL) 134 and a cleared block list (CBL) 136. The ABL 134 keeps track of the allocation of metablocks for recording update data while the CBL 136 keeps track of metablocks that have been deallocated and erased. In the preferred embodiment, the RAM 130 acts as a cache for control data stored in flash memory 200.

D) Address Tables

The logical to physical address translation module 140 shown in FIG. 2 is responsible for relating a host's logical address to a corresponding physical address in flash memory. Mapping between logical groups and physical groups (metablocks) are stored in a set of table and lists distributed among the nonvolatile flash memory 200 and the volatile but more agile RAM 130 (see FIG. 1.) An address table is maintained in flash memory, containing a metablock address for every logical group in the memory system. In addition, logical to physical address records for recently written sectors are temporarily held in RAM. These volatile records can be reconstructed from block lists and data sector headers in flash memory when the system is initialized after power-up. Thus, the address table in flash memory need be updated only infrequently, leading to a low percentage of overhead write operations for control data.

The hierarchy of address records for logical groups includes the open update block list, the closed update block list in RAM and the group address table (GAT) maintained in flash memory.

The open update block list is a list in controller RAM of data update blocks which are currently open for writing updated host sector data. The entry for a block is moved to the closed update block list when the block is closed. The closed update block list is a list in controller RAM of data update blocks which have been closed. A subset of the entries in the list is moved to a sector in the Group Address Table during a control write operation.

The Group Address Table (GAT) is a list of metablock addresses for all logical groups of host data in the memory system. The GAT contains one entry for each logical group, ordered sequentially according to logical address. The nth entry in the GAT contains the metablock address for the logical group with address n. In the preferred embodiment, it is a table in flash memory, comprising a set of sectors (referred to as GAT sectors) with entries defining metablock addresses for every logical group in the memory system. The GAT sectors are located in one or more dedicated control blocks (referred to as GAT blocks) in flash memory.

Figure 8A:
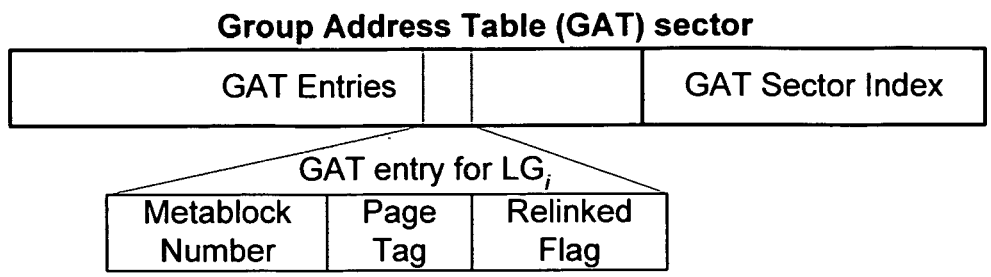
FIG. 8A illustrates the data fields of a group address table (GAT) sector.

FIG. 8A illustrates the data fields of a group address table (GAT) sector. A GAT sector may for example have sufficient capacity to contain GAT entries for a set of 128 contiguous logical groups. Each GAT sector includes two components, namely a set of GAT entries for the metablock address of each logical group within a range, and a GAT sector index. The first component contains information for locating the metablock associated with the logical address. The second component contains information for locating all valid GAT sectors within the GAT block. Each GAT entry has three fields, namely, the metablock number, the page tag as defined earlier in connection with FIG. 3A(iii), and a flag indicating whether the metablock has been relinked. The GAT sector index lists the positions of valid GAT sectors in a GAT block. This index is in every GAT sector but is superceded by the version of the next written GAT sector in the GAT block. Thus only the version in the last written GAT sector is valid.

Figure 8B:
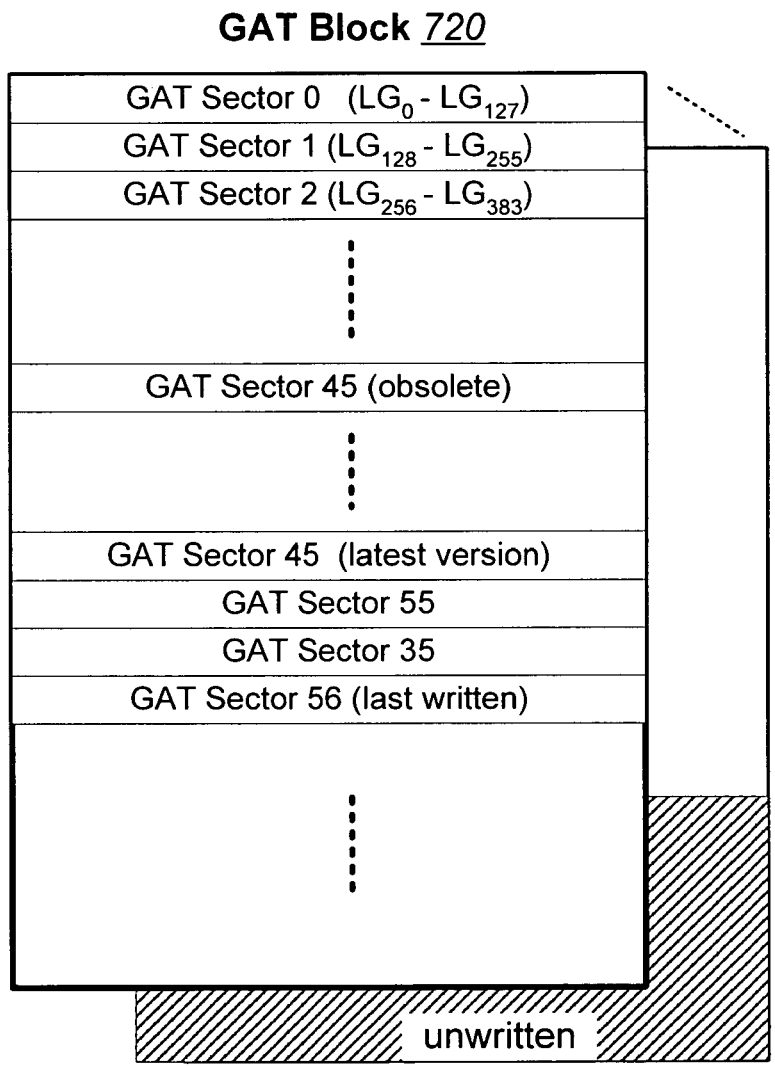
FIG. 8B illustrates an example of the group address table (GAT) sectors being recorded in a GAT block.

FIG. 8B illustrates an example of the group address table (GAT) sectors being recorded in one or more GAT block. A GAT block is a metablock dedicated to recording GAT sectors. When a GAT sector is updated, it is written in the next available physical sector location in the GAT block 720. Multiple copies of a GAT sector may therefore exist in the GAT block, with only the last written copy being valid. For example the GAT sector 45 has been updated at least two times with the latest version being the valid one. The location of each valid sector in the GAT block is identified by a set of indices in the last written GAT sector in the block. In this example, the last written GAT sector in the block is GAT sector 56 and its set of indices is the valid one superceding all previous ones. When the GAT block eventually becomes fully filled with GAT sectors, the block is compacted during a control write operation by rewriting all valid sectors to a new block location. The full block is then erased.

As described earlier, a GAT block contains entries for a logically contiguous set of groups in a region of logical address space. GAT sectors within a GAT block each contain logical to physical mapping information for 128 contiguous logical groups. The number of GAT sectors required to store entries for all logical groups within the address range spanned by a GAT block occupy only a fraction of the total sector positions in the block. A GAT sector may therefore be updated by writing it at the next available sector position in the block. An index of all valid GAT sectors and their position in the GAT block is maintained in an index field in the most recently written GAT sector. The fraction of the total sectors in a GAT block occupied by valid GAT sectors is a system design parameter, which is typically 25%. However, there is a maximum of 64 valid GAT sectors per GAT block. In systems with large logical capacity, it may be necessary to store GAT sectors in more than one GAT block. In this case, each GAT block is associated with a fixed range of logical groups.

Figure 9:
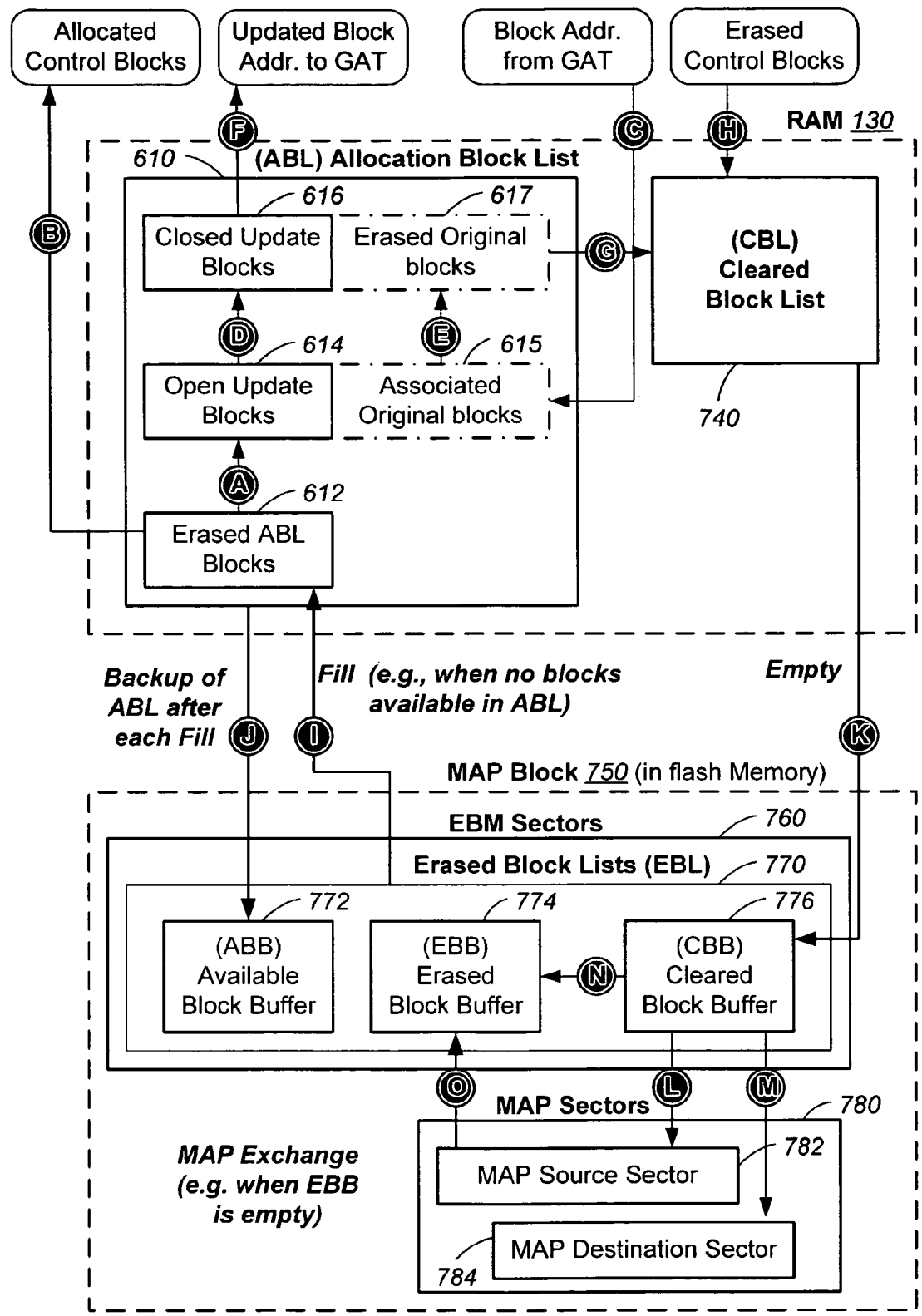
FIG. 9 is a schematic block diagram illustrating the distribution and flow of the control and directory information for usage and recycling of erased blocks.

A GAT update is performed as part of a control write operation, which is triggered when the ABL runs out of blocks for allocation (see FIG. 9.) It is performed concurrently with ABL fill and CBL empty operations. During a GAT update operation, one GAT sector has entries updated with information from corresponding entries in the closed update block list. When a GAT entry is updated, any corresponding entries are removed from the closed update block list (CUBL). For example, the GAT sector to be updated is selected on the basis of the first entry in the closed update block list. The updated sector is written to the next available sector location in the GAT block.

A GAT rewrite operation occurs during a control write operation when no sector location is available for an updated GAT sector. A new GAT block is allocated, and valid GAT sectors as defined by the GAT index are copied in sequential order from the full GAT block. The full GAT block is then erased.

A GAT cache is a copy in controller RAM 130 of entries in a subdivision of the 128 entries in a GAT sector. The number of GAT cache entries is a system design parameter, with typical value 32. A GAT cache for the relevant sector subdivision is created each time an entry is read from a GAT sector. Multiple GAT caches are maintained. The number is a design parameter with a typical value of 4. A GAT cache is overwritten with entries for a different sector subdivision on a least-recently-used basis.

E) Erased Metablock Management

Figure 7:
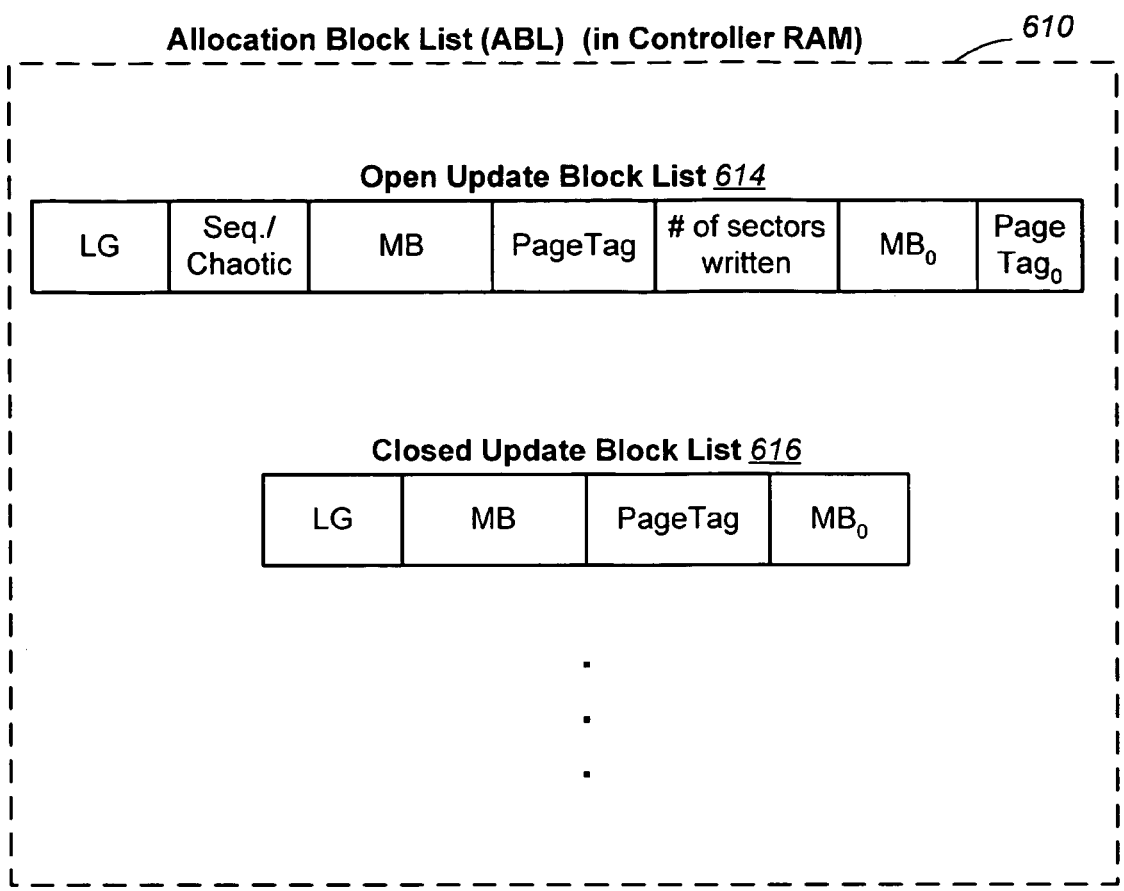
FIG. 7 illustrates a preferred embodiment of the structure of an allocation block list (ABL) for keeping track of opened and closed update blocks and erased blocks for allocation.

The erase block manager 160 shown in FIG. 2 manages erase blocks using a set of lists for maintaining directory and system control information. These lists are distributed among the controller RAM 130 and flash memory 200. When an erased metablock must be allocated for storage of user data, or for storage of system control data structures, the next available metablock number in the allocation block list (ABL) (see FIG. 7) held in controller RAM is selected. Similarly, when a metablock is erased after it has been retired, its number is added to a cleared block list (CBL) also held in controller RAM. Relatively static directory and system control data are stored in flash memory. These include erased block lists and a bitmap (MAP) listing the erased status of all metablocks in the flash memory. The erased block lists and MAP are stored in individual sectors and are recorded to a dedicated metablock, known as a MAP block. These lists, distributed among the controller RAM and flash memory, provide a hierarchy of erased block records to efficiently manage erased metablock usage.

FIG. 9 is a schematic block diagram illustrating the distribution and flow of the control and directory information for usage and recycling of erased blocks. The control and directory data are maintained in lists which are held either in controller RAM 130 or in a MAP block 750 residing in flash memory 200.

In the preferred embodiment, the controller RAM 130 holds the allocation block list (ABL) 610 and a cleared block list (CBL) 740. As described earlier in connection with FIG. 7, the allocation block list (ABL) keeps track of which metablocks have recently been allocated for storage of user data, or for storage of system control data structures. When a new erased metablock need be allocated, the next available metablock number in the allocation block list (ABL) is selected. Similarly, the cleared block list (CBL) is used to keep track of update metablocks that have been de-allocated and erased. The ABL and CBL are held in controller RAM 130 (see FIG. 1) for speedy access and easy manipulation when tracking the relatively active update blocks.

The allocation block list (ABL) keeps track of a pool of erased metablocks and the allocation of the erased metablocks to be an update block. Thus, each of these metablocks that may be described by an attribute designating whether it is an erased block in the ABL pending allocation, an open update block, or a closed update block. FIG. 9 shows the ABL containing an erased ABL list 612, the open update block list 614 and the closed update block list 616. In addition, associated with the open update block list 614 is the associated original block list 615. Similarly, associated with the closed update block list is the associated erased original block list 617. As shown previously in FIG. 7, these associated lists are a subset of the open update block list 614 and the closed update block list 616 respectively. The erased ABL block list 612, the open update block list 614, and the closed update block list 616 are all subsets of the allocation block list (ABL) 610, the entries in each having respectively the corresponding attribute.

The MAP block 750 is a metablock dedicated to storing erase management records in flash memory 200. The MAP block stores a time series of MAP block sectors, with each MAP sector being either an erase block management (EBM) sector 760 or a MAP sector 780. As erased blocks are used up in allocation and recycled when a metablock is retired, the associated control and directory data is preferably contained in a logical sector which may be updated in the MAP block, with each instance of update data being recorded to a new block sector. Multiple copies of EBM sectors 760 and MAP sectors 780 may exist in the MAP block 750, with only the latest version being valid. An index to the positions of valid MAP sectors is contained in a field in the EMB block. A valid EMB sector is always written last in the MAP block during a control write operation. When the MAP block 750 is full, it is compacted during a control write operation by rewriting all valid sectors to a new block location. The full block is then erased.

Each EBM sector 760 contains erased block lists (EBL) 770, which are lists of addresses of a subset of the population of erased blocks. The erased block lists (EBL) 770 act as a buffer containing erased metablock numbers, from which metablock numbers are periodically taken to re-fill the ABL, and to which metablock numbers are periodically added to re-empty the CBL. The EBL 770 serves as buffers for the available block buffer (ABB) 772, the erased block buffer (EBB) 774 and the cleared block buffer (CBB) 776.

The available block buffer (ABB) 772 contains a copy of the entries in the ABL 610 immediately following the previous ABL fill operation. It is in effect a backup copy of the ABL just after an ABL fill operation.

The erased block buffer (EBB) 774 contains erased block addresses which have been previously transferred either from MAP sectors 780 or from the CBB list 776 (described below), and which are available for transfer to the ABL 610 during an ABL fill operation.

The cleared block buffer (CBB) 776 contains addresses of erased blocks which have been transferred from the CBL 740 during a CBL empty operation and which will be subsequently transferred to MAP sectors 780 or to the EBB list 774.

Each of the MAP sectors 780 contains a bitmap structure referred to as MAP. The MAP uses one bit for each metablock in flash memory, which is used to indicate the erase status of each block. Bits corresponding to block addresses listed in the ABL, CBL, or erased block lists in the EBM sector are not set to the erased state in the MAP.

Any block which does not contain valid data structures and which is not designated as an erased block within the MAP, erased block lists, ABL or CBL is never used by the block allocation algorithm and is therefore inaccessible for storage of host or control data structures. This provides a simple mechanism for excluding blocks with defective locations from the accessible flash memory address space.

The hierarchy shown in FIG. 9 allows erased block records to be managed efficiently and provides full security of the block address lists stored in the controller's RAM. Erased block entries are exchanged between these block address lists and one or more MAP sectors 780, on an infrequent basis. These lists may be reconstructed during system initialization after a power-down, via information in the erased block lists and address translation tables stored in sectors in flash memory, and limited scanning of a small number of referenced data blocks in flash memory.

The algorithms adopted for updating the hierarchy of erased metablock records results in erased blocks being allocated for use in an order which interleaves bursts of blocks in address order from the MAP block 750 with bursts of block addresses from the CBL 740 which reflect the order blocks were updated by the host. For most metablock sizes and system memory capacities, a single MAP sector can provide a bitmap for all metablocks in the system. In this case, erased blocks are always allocated for use in address order as recorded in this MAP sector.

(i) Erase Block Management Operations

As described earlier, the ABL 610 is a list with address entries for erased metablocks which may be allocated for use, and metablocks which have recently been allocated as data update blocks. The actual number of block addresses in the ABL lies between maximum and minimum limits, which are system design variables. The number of ABL entries formatted during manufacturing is a function of the card type and capacity. In addition, the number of entries in the ABL may be reduced near the end of life of the system, as the number of available erased blocks is reduced by failure of blocks during life. For example, after a fill operation, entries in the ABL may designate blocks available for the following purposes. Entries for Partially written data update blocks with one entry per block, not exceeding a system limit for a maximum of concurrently opened update blocks. Between one to twenty entries for Erased blocks for allocation as data update blocks. Four entries for erased blocks for allocation as control blocks.

(ii) ABL Fill Operation

As the ABL 610 becomes depleted through allocations, it will need to be refilled. An operation to fill the ABL occurs during a control write operation. This is triggered when a block must be allocated, but the ABL contains insufficient erased block entries available for allocation as a data update block, or for some other control data update block. During a control write, the ABL fill operation is concurrent with a GAT update operation.

The following actions occur during an ABL fill operation.
1. ABL entries with attributes of current data update blocks are retained.
2. ABL entries with attributes of closed data update blocks are retained, unless an entry for the block is being written in the concurrent GAT update operation, in which case the entry is removed from the ABL.
3. ABL entries for unallocated erase blocks are retained.
4. The ABL is compacted to remove gaps created by removal of entries, maintaining the order of entries.
5. The ABL is completely filled by appending the next available entries from the EBB list.
6. The ABB list is over-written with the current entries in the ABL.

(iii) CBL Empty Operation

The CBL is a list of erased block addresses in controller RAM with the same limitation on the number of erased block entries as the ABL. An operation to empty the CBL occurs during a control write operation. It is therefore concurrent with an ABL fill/GAT update operations, or CBI block write operations. In a CBL empty operation, entries are removed from the CBL 740 and written to the CBB list 776.

(iv) MAP Exchange Operation

A MAP exchange operation between the erase block information in the MAP sectors 780 and the EBM sectors 760 may occur periodically during a control write operation, when the EBB list 774 is empty. If all erased metablocks in the system are recorded in the EBM sector 760, no MAP sector 780 exists and no MAP exchange is performed. During a MAP exchange operation, a MAP sector feeding the EBB 774 with erased blocks is regarded as a source MAP sector 782. Conversely, a MAP sector receiving erased blocks from the CBB 776 is regarded as a destination MAP sector 784. If only one MAP sector exists, it acts as both source and destination MAP sector, as defined below.

The following actions are performed during a MAP exchange.

1. A source MAP sector is selected, on the basis of an incremental pointer.
2. A destination MAP sector is selected, on the basis of the block address in the first CBB entry that is not in the source MAP sector.
3. The destination MAP sector is updated, as defined by relevant entries in the CBB, and the entries are removed from the CBB.
4. The updated destination MAP sector is written in the MAP block, unless no separate source MAP sector exists.
5. The source MAP sector is updated, as defined by relevant entries in the CBB, and the entries are removed from the CBB.
6. Remaining entries in the CBB are appended to the EBB.
7. The EBB is filled to the extent possible with erased block addresses defined from the source MAP sector.
8. The updated source MAP sector is written in the MAP block.
9. An updated EBM sector is written in the MAP block.

(v) List Management

FIG. 9 shows the distribution and flow of the control and directory information between the various lists. For expediency, operations to move entries between elements of the lists or to change the attributes of entries, identified in FIG. 9 as [A] to [O], are as follows.

[A] When an erased block is allocated as an update block for host data, the attributes of its entry in the ABL are changed from Erased ABL Block to Open Update Block.

[B] When an erased block is allocated as a control block, its entry in the ABL is removed.

[C] When an ABL entry is created with Open Update Block attributes, an Associated Original Block field is added to the entry to record the original metablock address for the logical group being updated. This information is obtained from the GAT.

[D] When an update block is closed, the attributes of its entry in the ABL are changed from Open Update Block to Closed Update Block.

[E] When an update block is closed, its associated original block is erased and the attributes of the Associated Original Block field in its entry in the ABL are changed to Erased Original Block.

[F] During an ABL fill operation, any closed update block whose address is updated in the GAT during the same control write operation has its entry removed from the ABL.

[G] During an ABL fill operation, when an entry for a closed update block is removed from the ABL, an entry for its associated erased original block is moved to the CBL.

[H] When a control block is erased, an entry for it is added to the CBL.

[I] During an ABL fill operation, erased block entries are moved to the ABL from the EBB list, and are given attributes of Erased ABL Blocks.

[J] After modification of all relevant ABL entries during an ABL fill operation, the block addresses in the ABL replace the block addresses in the ABB list.

[K] Concurrently with an ABL fill operation during a control write, entries for erased blocks in the CBL are moved to the CBB list.

[L] During a MAP exchange operation, all relevant entries are moved from the CBB list to the MAP destination sector.

[M] During a MAP exchange operation, all relevant entries are moved from the CBB list to the MAP source sector.

[N] Subsequent to [L] and [M] during a MAP exchange operation, all remaining entries are moved from the CBB list to the EBB list.

[O] Subsequent to [N] during a MAP exchange operation, entries other than those moved in

[M] are moved from the MAP source sector to fill the EBB list, if possible.

F) Control Data Management

FIG. 20 illustrates the hierarchy of the operations performed on control data structures in the course of the operation of the memory management. Data Update Management Operations act on the various lists that reside in RAM. Control write operations act on the various control data sectors and dedicated blocks in flash memory and also exchange data with the lists in RAM.

Data update management operations are performed in RAM on the ABL, the CBL and the chaotic sector list. The ABL is updated when an erased block is allocated as an update block or a control block, or when an update block is closed. The CBL is updated when a control block is erased or when an entry for a closed update block is written to the GAT. The update chaotic sector list is updated when a sector is written to a chaotic update block.

A control write operation causes information from control data structures in RAM to be written to control data structures in flash memory, with consequent update of other supporting control data structures in flash memory and RAM, if necessary. It is triggered either when the ABL contains no further entries for erased blocks to be allocated as update blocks, or when the CBI block is rewritten.

In the preferred embodiment, the ABL fill operation, the CBL empty operation and the EBM sector update operation are performed during every control write operation. When the MAP block containing the EBM sector becomes full, valid EBM and MAP sectors are copied to an allocated erased block, and the previous MAP block is erased.

One GAT sector is written, and the Closed Update Block List is modified accordingly, during every control write operation. When a GAT block becomes full, a GAT rewrite operation is performed.

A CBI sector is written, as described earlier, after certain chaotic sector write operations. When the CBI block becomes full, valid CBI sectors are copied to an allocated erased block, and the previous CBI block is erased.

A MAP exchange operation, as described earlier, is performed when there are no further erased block entries in the EBB list in the EBM sector.

A MAP Address (MAPA) sector, which records the current address of the MAP block, is written in a dedicated MAPA block on each occasion the MAP block is rewritten. When the MAPA block becomes full, the valid MAPA sector is copied to an allocated erased block, and the previous MAPA block is erased.

A Boot sector is written in a current Boot block on each occasion the MAPA block is rewritten. When the boot block becomes full, the valid Boot sector is copied from the current version of the Boot block to the backup version, which then becomes the current version. The previous current version is erased and becomes the backup version, and the valid Boot sector is written back to it.

Examples of Management for Erase Operations

In order to improve performance, when a host issues a command to erase a portion of the memory, such as an Erase Sectors command that specifies the logical sectors to erase, the system should be able to determine which of the specified sectors span one or more complete logical groupings. Any such complete meta-blocks or logical groupings can then be treated as a whole, rather than a collection of individual sectors, with any specified sectors not part of such a complete grouping can be treated on the sector level as described above. For example, when the Erase Sectors command spans a full grouping of erase blocks, the system can execute the command on these by the means of physical block erases rather than by executing a logical erase by writing the erased sector pattern to the specified sectors. This can make the execution time much shorter, especially in the case when a large amount of the memory, or even the whole card, is erased by a single command.

The invention also addresses the problem of power loss recovery: If power is lost while a block is being erased, it may look corrupted, or a block may look erased or well programmed, but may be disturbed by the previously aborted erase operation. Another problem is to provide compatibility with protocols for systems where the controller functions largely reside on the host, such Memory Stick-type systems, where the system needs to return the information about whether the sector being read was erased by an Erase Sectors command or not, or whether it also belongs to a block erased by a full logical group Erased sectors command.

Although the various aspects of the present invention are described using a flash memory as the exemplary embodiment, the specifics of the memory is read, written, and erased do enter into the primary aspects of the invention. Consequently, the invention applies more generally to memory systems based on other technologies such as those described in U.S. patent applications Ser. No. 10/841,379.

A) Multi-Mode Erase

Figure 10:
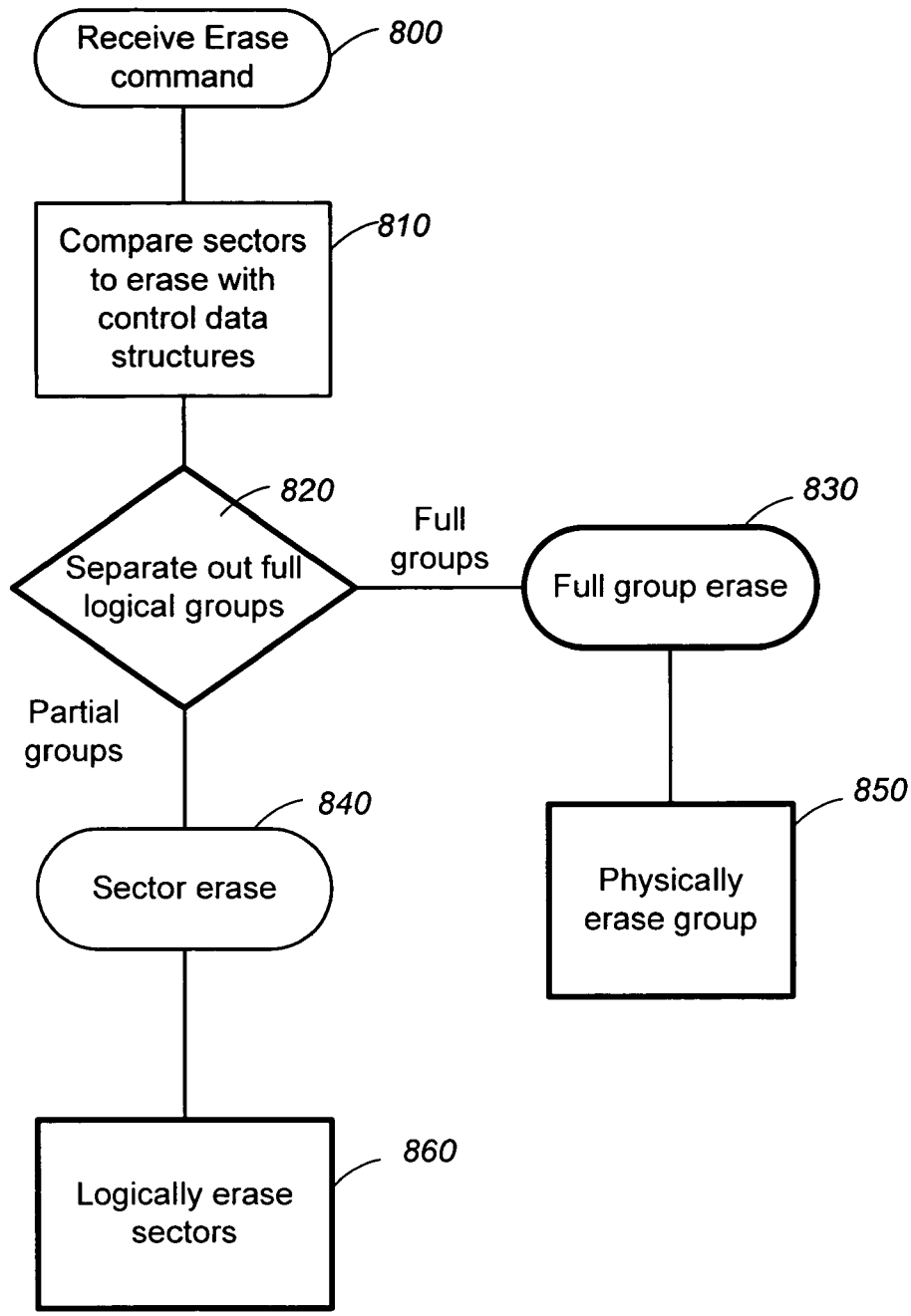
FIG. 10 is a flowchart illustrating erase management using multiple methods of erase.

FIG. 10 is a flowchart to illustrate in a simple form the use of multiple erase methods depending on whether the erase command includes memory areas corresponding to full logical groups. The process begins at 800 with an erase command, which can originate either on the memory system as part of its data management operations or a host, typically as an Erase Sectors command that specifies the (logical) sectors to be erased. Based on the control data structure tables, the controller determines whether any of he specified sectors span a full logical group at step 810.

Step 820 then splits Erase Sectors and Format commands into Erase Logical Group, for any full logical groups, and Erase Sectors, for parts less than a full logical group, commands. In a typical controller arrangement, this is executed by the "front end" (the front or host interface of the memory system) firmware. This may result in the segmentation of a contiguous set of specified logical addresses into three sets. For example, consider the case where a logical group has 100 sectors. If an Erase Sectors command specifies logical sectors 10-290, sectors 100-199 would form a full logical group that could be erased accordingly, while sectors 10-99 and 200-290, as each is only part of a full logical group, would be subjected to a logical, sector-based erase.

Having split up the initial erase command (800), the front end would then issue the Sector Erase (840) and Full group Erase (830) to the "back end" (the media management part that can be common for differing interfaces) of the controller. The back end firmware will then have an ability to recognize the "full logical group" Erase command call from the front end, or to have special Erase Logical Group function call. (Alternately, if the original command spans multiple full logical groups, only some of these full logical groups need to use the alternate erase of 830, the others using Sector Erase 840.) For the sectors assigned for Sector Erase command (840), a logical erase can then be performed according to the memory's usual procedures, such as writing them with a blank (as erased) data pattern. Note that steps 850 and 860 may, with respect to one another, be performed in any convenient order or be interleaved.

The "full logical group" Erase command call from the front end, or special Erase Logical Group function call, is then executed in step 850. The next section describes several embodiments of erase methods for full logical groups. As described there, these methods typically execute a true, physical erase of the logical group and set flag values so that the system can recover in the case of a power loss event. This is generally done through use of a special record, maintained in the non-volatile memory, about the erase operation to be performed, where the record can be updated at the completion of the erase operation as a whole or as parts of it are completed.

Techniques related to erase processes are presented in U.S. patent applications Ser. Nos. 10/751,096 and 11/020,345, including methods of marking memory sectors as erased and otherwise determining whether they have been erased that are complimentary to, and could be combined with, the various aspects of the present invention.

B) Examples of Alternate Erase Methods for Complete Logical Groups

Several implementations of alternate erase methods can be used for fully spanned logical groups. This section describes several examples based on the exemplary memory system described above and its control data structure tables.

(i) True Erase with Special Update Block

In a first embodiment, when the sectors to be erased span a logical group, the corresponding metablocks are physically erased and the erased group or groups are added to the existing erase pool. This can be implemented by introducing a set of firmware that can support the physical erase of logical groups and an increase in the erase pool. The main focus of the method is to provide a safe sequence of erase operations and control updates, so that the card can be recovered in the case of power loss.

The controller 100 (FIG. 1) of the memory system 20 will typically have its hardware, firmware, software, or some combination of these split into a front end (FE) and back end (BE), where the front end is the front or host interface memory system. The back end will then be a media management part that can be common for differing interfaces and across different products. In the exemplary memory system, a main part of the back end is a media management layer (MML) that makes the decisions about how to use flash memory including doing all of the address translation, update and block handling. Other parts of the back end can include a buffer management unit (BMU), which controls the data buffer and initiates transfers to/from host, a low level sequencer (LLS), which initiates transfers to/from flash, and a flash control layer which controls a flash interface module, which in turn controls the flash interface.

The following sequence executed by the media management layer can provide a safe mechanism for erasing a logical group:

1. Open a new Update Block for the Logical Group. If the current number of Update Blocks is up to the limit, then close (garbage collect) another Update block. If the Logical Group has an open Update block, then force closure of the Update block which belongs to the Logical group.
2. Write at least one sector to the new Update block with any data and "erased" flag set in the header.
3. Erase the Original block of the Logical Group.
4. Update GAT marking the Logical Group as physically erased. Update erase block management (EBM) 760 (FIG. 18a) by adding the erased block to the erase pool. Perform EBM-MAP exchange if EBL get full as the erase pool increases.
5. Erase the new Update Block of the Logical Group. There is no need to maintain it in control update, as this block is not referenced by any data structure and is meant to be erased.
6. As a result, all the block associated with the Logical Group are erased. If power loss happens in the middle of this sequence, the "erased" sector can be found and the operation can be completed.

The back end firmware will have the ability to recognize a "full logical group" Erase command call from the front end, or to have special Erase Logical Group function call, where the front end will have split Erase Sector and Format commands into Erase Logical Group and Erase Sectors (less than a logical group) commands. The buffer management unit (BMU) and the front end should be configurable to indicate an "ES"-type erase status flag, such as that found in the Memory Stick protocol, which is defined by media management layer (MML) on the basis of address translation.

Under this embodiment, every Logical Group erase will typically require two meta-blocks to be erased and two extra programs. One erase-write cycle on card level will cause at least two physical erase-write cycles of every chip. It has the feature, which can be attractive in industrial and other products, that it has a true erase of data and pre-conditioning of the card to the erased state.

As noted, in some systems, such as found in the Memory Stick (MS) protocol, have a flag on a read operation from an erased block. For example, in the present embodiment, the buffer management unit (BMU) and the front end should be configurable to indicate this flag. To provide more detail, the following digression describes methods of supporting systems having a status indicator of a read operation from an Erased block, such as the MS-Pro Erase and Format commands. (In the exemplary memory systems, the "logical group" can be associated with the MS block.)

Although the specifics will vary according to the particular system, the following set of requirements can be taking as typical:

[A] Ability to return an "Erased Status" (e.g., in the MS-PRO Status byte the "ES" bit) and/or erased data in response to a read operation from an Erased block.
[B] Erase block is taken as a block on which an Erase operation was done.
[C] This means that if the Host performs ERASE operation (with Erase command) or by doing Full Format (in which Erase shall be done according the specification), the expected erased Blocks shall have all "FF"s as their content and that an "Erased" status (e.g., the "ES" bit shall be set to "1") if a Read operation from one of their sectors is done.
[D] A typical performance requirement is that if a card that is Formatted (Quick or Full) must be able to support the corresponding minimum performance requirements (e.g., Class2—15 Mb/s). (In some cases, this may require all garbage collection be eliminated).

To support MS-Pro Erase and Format commands, the "MS" block can be defined to have the same size as a Logical Group of the exemplary memory system (equal to one metablock) of any configuration, from 64 KB to 2 MB. The ES flag should only be asserted if the host reads a block (Logical Group) "erased" by a Single Erase Sectors command. If at least one sector within a previously erased block has been updated, then the ES flag should not be set if any sector of the block is read. Also, there is no time constraint on Format command and the writing of FFs or 00s instead of true erase is allowed unless this contradicts the other requirements.

(ii) Marking Sectors as Erased

A second set of embodiments involves marking full logical groups as erased, where the logical group has all sectors written with FF or 00 data and an "erased" flag set in corresponding headers. (The logical group can again be associated with an MS block.)

More specifically, the back end firmware could to mark sector headers with the "erased" flag in addition to writing FFs or 00s. In the case of a partial update of previously erased logical group, if the host reads any sector from the logical group, the ES flag should not be set. If the logical group has an open Update block, then this fact should indicate that the ES flag should not be set. If the Update block should be closed, and the garbage collection performed on the logical group, then there are several options. In a first version, the sectors, which have not been updated by the host should be re-written to the new meta-block with FF or 00 data and the "erased" flag unset. This can be done by generation of FF or 00 data and headers instead of data copying and flag toggling. In a second option, the sectors can be copied "as is", with "erased" flags set in headers, and their new no-erased state will be indicated by a flag of the first sector that has been updated by the host (or padded out with 0s if the write command is not aligned to the meta-page boundary), in the metablock. In the case of a random read, the first sector in the meta-block should be checked to see if a sector to be read by the host looks "erased". Alternatively, in a third option, the logical group can be marked as "logically" erased in the GAT, if there is room there for an extra flag. In this case, all the data of the Logical Group will not be changed, but will not be read, as the host will be sent FFs or 00s as if the sectors were erased.

The back end firmware would again have an ability to recognize the "full logical group" Erase command call from the front end, or to have special Erase Logical Group function call, where the front end could split Erase Sector and Format commands into Erase Logical Group and Erase Sectors (for less than a logical group) commands. The buffer management unit (BMU) and the front end should again be configurable to be configurable to indicate ES flag, which is defined by the media manage layer on the basis of address translation (in the third options), or by analysis of sector headers (in the first two options).

(iii) Reformat the Card in the Case of Format Command

A third embodiment is just to reformat the memory in case of a format command (which means Erase Sectors for the entire card), so that the card is reformatted as new. In order to do this, the memory system should contain the formatted code, where it is preferable that the formatter code is able to determine new, grown bad blocks. Although this results in card pre-conditioning, it may require extra memory space and a more advanced formatter.

(iv) Block Erase without Updates

In another embodiment, the system will erase metablocks for the "erased" logical groups, but without updating the erased block lists (EBL) 230 and MAP 240. Under this approach, the metablock to which the GAT points is erased. The system should make sure that the logical group to be "erased" is consolidated into an intact metablock and the GAT is updated to point to the erased metablock, so that it does not get lost. The erased block lists (EBL) 230 and MAP 240 should be updated as if the metablock is not erased. Under this approach, power loss during block erase may cause the block to look corrupted.

(v) Fast True Erase by Single Blocks

A fifth embodiment uses a fast true erase done by single blocks. The information of a requested erase is recorded in erase block management (EBM, 760) sector, then the metablock pointed by the GAT will be erased. The GAT can then be updated with the null pointer and the erased block can be added to the erased block lists (EBL) 230 and MAP 240.

This method would introduce a new set of firmware functions that can support the physical erase of logical groups and their addition to the erase pool. The main focus of the method is to provide a safe sequence of erase operations and control updates so that the card can be recovered in the case of power loss. A number of implementations are possible, but the following exemplary sequence executed by the media management layer can provide a safe mechanism for erasing a logical group:

1. Ensure that the logical group to be erased is consolidated into an Intact meta-block and the GAT is updated to point to the meta-block, which is going to be erased. This will simplify the number of cases to be handled.

2. Update EBM sector with the information about the Logical group and corresponding meta-block to be erased. Thus, in the case of a write abort, the operation can be completed.

3. Erase the Intact block of the Logical Group.

4. Update GAT marking the Logical Group as physically erased.

5. Update EBM by adding the erased block to the erase pool. Perform EBM-MAP exchange if EBL get full as the erase pool increases. Clear the record about the Logical group to be erased as the operation is complete.

The back end firmware will again have an ability to recognize the "full logical group" Erase command call from the front end or to have special Erase Logical Group function call, where front end should split Erase Sector and Format commands into Erase Logical Group and Erase Sectors (less than a logical group) commands. BMU and FE should be configurable in the case of a Read command to indicate an ES-type flag, which is defined by the media management layer on the basis of address translation. This embodiment uses one meta-block erase per Logical Group Erase and two EBM writes and one GAT write per meta-block or logical group erased.

(vi) Fast True Erase by Multiple Blocks

This embodiment is similar to the previously described embodiment, but can handle a big group of blocks to be erased with minimal number of control updates. The information of a requested erases (up to the entire card) is recorded in the EBM sector, then the meta-block pointed by GAT will be erased. The GAT can then be updated with the null pointer and the erased block can be added to EBL and MAP.

This embodiment similarly adds a new set of firmware functions that can support physical erase of logical groups and increase in the erase pool. The main focus of the method is to provide a safe sequence of erase operations and control updates so that the card can be recovered in the case of power loss. The following sequence executed by the media management layer can provide a safe mechanism for erasing a logical group:

1. Ensure that the logical groups to be erased are consolidated into Intact meta-blocks and the GAT sectors are updated to point to the meta-blocks which are going to be erased. This will simplify the number of cases to be handled.

2. Update EBM sector with the information about the Erase command requesting erasure of multiple Logical groups and corresponding meta-blocks to be erased (start LBA and command length).

3. Erase Intact blocks of a group of consecutive Logical Groups (up to 128 in the exemplary embodiment, provided they all belong to the same GAT sector). If the memory supports a physical concurrent multi-block erase feature, this can be used to further optimize the process.

4. Update the GAT sector marking the Logical Groups as physically erased.

5. Update EBM by adding the erased blocks to the erase pool. Perform EBM-MAP exchange if EBL get full as the erase pool increases. Decrement the count of Logical groups (remaining length) to be erased.

6. Repeat from the start until the count is zero.

In the case of power loss, the group of the blocks to be erased can be binary searched to find the last erased meta-block. As precaution, the last "erased" and the first "not erased" blocks can be erased in order to avoid under erase. Then the GAT and EBM is updated with information about erased Logical Groups and meta-blocks.

The backend firmware should have an ability to recognize the "full logical group" Erase command call from the front end, or to have special Erase Logical Group function call, where the front end should split Erase Sector and Format commands into Erase Logical Group and Erase Sectors (less than a logical group) commands. BMU and FE should be configurable to indicate ES flag, which is defined by the media management layer on the basis of address translation. This embodiment uses one meta-block erase per Logical Group Erase and almost no programs in the case of a Full card Erase command. Also, the time to handle write abort should be taken into account to ensure that it does not violate timing requirements. As mentioned in other embodiments above, from the process may be further optimized by using multi-block erases if they are supported.

The patents, patent applications, articles and book portions identified above are all hereby expressly incorporated in their entirety into this specification by these references.

Although the invention has been described with respect to various exemplary embodiments, it will be understood that the invention is entitled to protection within the full scope of the appended claims.

It is claimed:

1. A method of operating a non-volatile memory system comprising a controller circuit and a non-volatile flash memory circuit, where the non-volatile memory circuit is formed of a plurality of erase blocks each having one or more sectors, each sector comprising a plurality of individually programmable non-volatile memory cells and including a portion for user data portion and a portion for header data, the method comprising:

managing the memory circuit by the controller by organizing the erase blocks into composite logical groups formed of multiple erase blocks according to a control data structure maintained by the controller;

receiving an erase command specifying one or more sectors of the memory circuit for erase; and in response to the erase command, executing an operation comprising:

determining which of the specified sectors form complete logical groups according to the control data structure and which of the specified sectors do not form complete logical groups according to the control data structure;

performing a physical erase operation on those of The specified sectors determined to form complete logical groups; and performing a write operation to logically mark as erased, without performing a physical erase operation on, those of the specified sectors determined not to form complete logical groups.

2. The method of claim 1, wherein said write operation includes writing a indication to the header portion to thereby mark as logically erased of the specified sectors determined not to form complete logical groups.

3. The method of claim 1, wherein said write operation includes writing to the user portion a data pattern of all the cells therein being frilly programmed to thereby mark as logically erased of the specified sectors determined not to form complete logical groups.

4. The method of claim 1, wherein the number of complete logical groups formed by the specified sectors are a plurality and said plurality of complete logical groups are physically erased concurrently in the physical erase operation.

5. The method of claim 4, wherein the memory circuit returns progress status information to the controller circuit during the physical erase operation.

6. The method of claim 1, wherein the memory system is connected to a host device from which the erase command is received.

7. The method of claim 6, further comprising:

subsequently to receiving the erase command, receiving from the host a read command for a one of the specified sectors determined not to form complete logical groups; and in response to the read command, returning to the host values corresponding to the erased state for the user portion of said one of the specified sectors.

8. The method of claim 1, wherein the erase command originates within the memory system.

9. The method of claim 1, wherein the controller circuit has firmware that includes front end firmware and back end firmware, said determining being performed by the front end firmware.

10. The method of claim 1, further comprising:

subsequent to executing said operation in response to the erase command, in response to another command, performing a physical erase operation on those sectors the sectors logically marked as erased.

* * * * *

UNITED STATES PATENT AND TRADEMARK OFFICE
CERTIFICATE OF CORRECTION

PATENT NO. : 7,624,239 B2 Page 1 of 1
APPLICATION NO. : 11/273774
DATED : November 24, 2009
INVENTOR(S) : Bennett et al.

It is certified that error appears in the above-identified patent and that said Letters Patent is hereby corrected as shown below:

Column 23, line 25, please delete "frilly" and insert -- fully --.

Signed and Sealed this

Twenty-third Day of February, 2010

David J. Kappos
*Director of the United States Patent and Trademark Office*

UNITED STATES PATENT AND TRADEMARK OFFICE
CERTIFICATE OF CORRECTION

PATENT NO.       : 7,624,239 B2  
APPLICATION NO.  : 11/273774  
DATED            : November 24, 2009  
INVENTOR(S)      : Bennett et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 261 days.

Signed and Sealed this

Twenty-sixth Day of October, 2010

David J. Kappos  
*Director of the United States Patent and Trademark Office*